United States Patent [19]

Chen

[11] Patent Number: 4,714,848

[45] Date of Patent: Dec. 22, 1987

[54] ELECTRICALLY INDUCED MECHANICAL PRECOMPRESSION OF FERROELECTRIC PLATES

[75] Inventor: Peter J. Chen, Albuquerque, N. Mex.

[73] Assignee: The United States of America as represented by the United States Department of Energy, Washington, D.C.

[21] Appl. No.: 20,996

[22] Filed: Mar. 2, 1987

[51] Int. Cl.$^4$ .................... H01L 41/08; H04R 17/00
[52] U.S. Cl. .................................. 310/359; 310/358; 29/25.35; 361/225
[58] Field of Search .................. 310/357–359, 310/366; 361/225; 29/25.35

[56] References Cited

U.S. PATENT DOCUMENTS

| | | | |
|---|---|---|---|
| 2,633,543 | 3/1953 | Howatt | 310/359 X |
| 3,374,367 | 3/1968 | Cowan | 310/359 |
| 3,950,659 | 4/1976 | Dixon et al. | 310/359 |
| 3,958,161 | 5/1976 | Dixon | 310/359 X |
| 4,087,716 | 5/1978 | Heywang | 310/359 X |
| 4,160,184 | 7/1979 | Ljung | 310/359 X |
| 4,633,204 | 12/1986 | Gounji et al. | 310/359 X |

*Primary Examiner*—Mark O. Budd
*Attorney, Agent, or Firm*—George H. Libman; Judson R. Hightower

[57] ABSTRACT

A method of electrically inducing mechanical precompression of a ferroelectric plate covered with electrodes utilizes the change in strains of the plate as functions of applied electric field. A first field polarizes and laterally shrinks the entire plate. An outer portion of the electrodes are removed, and an opposite field partially depolarizes and expands the central portion of the plate against the shrunk outer portion.

11 Claims, 5 Drawing Figures

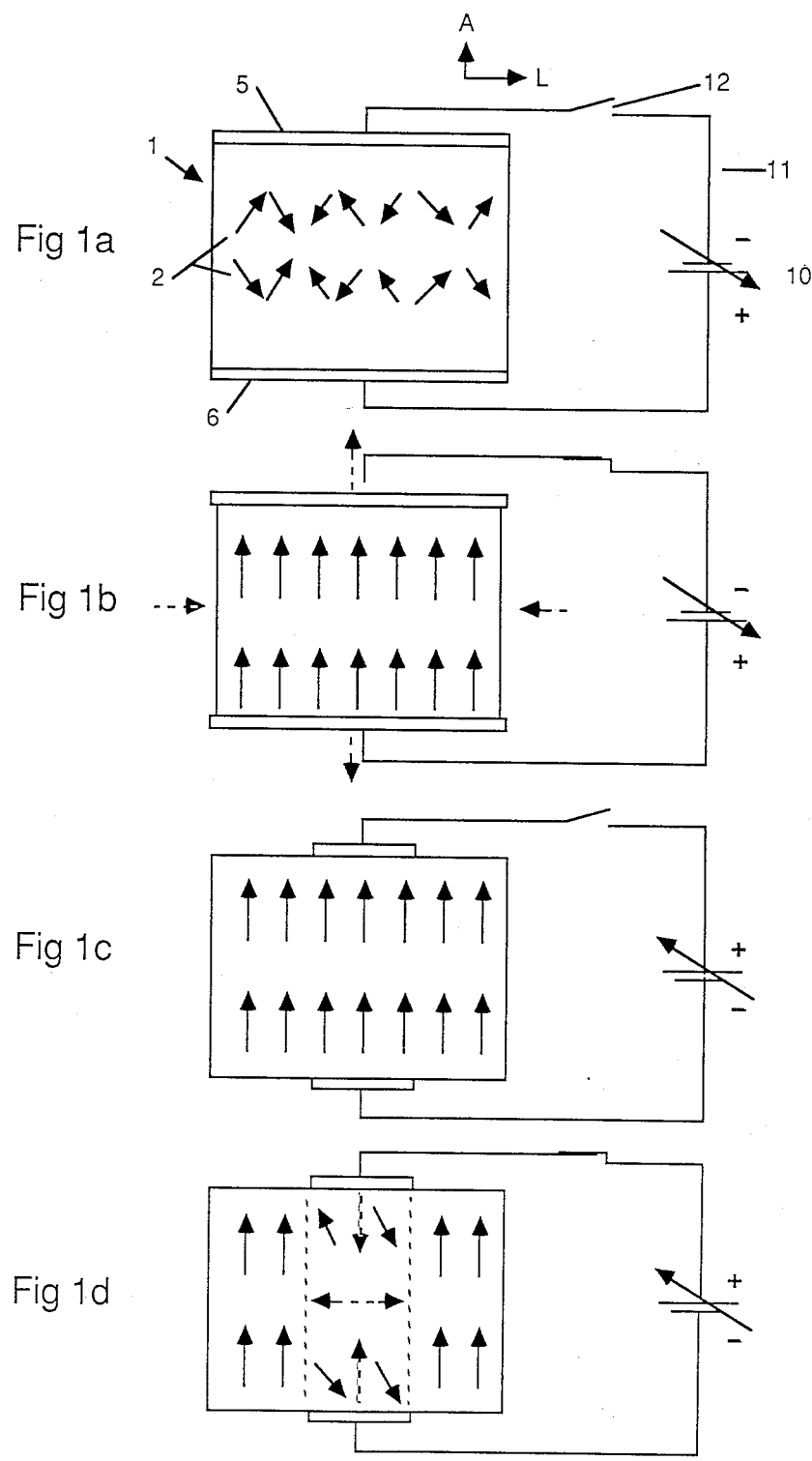

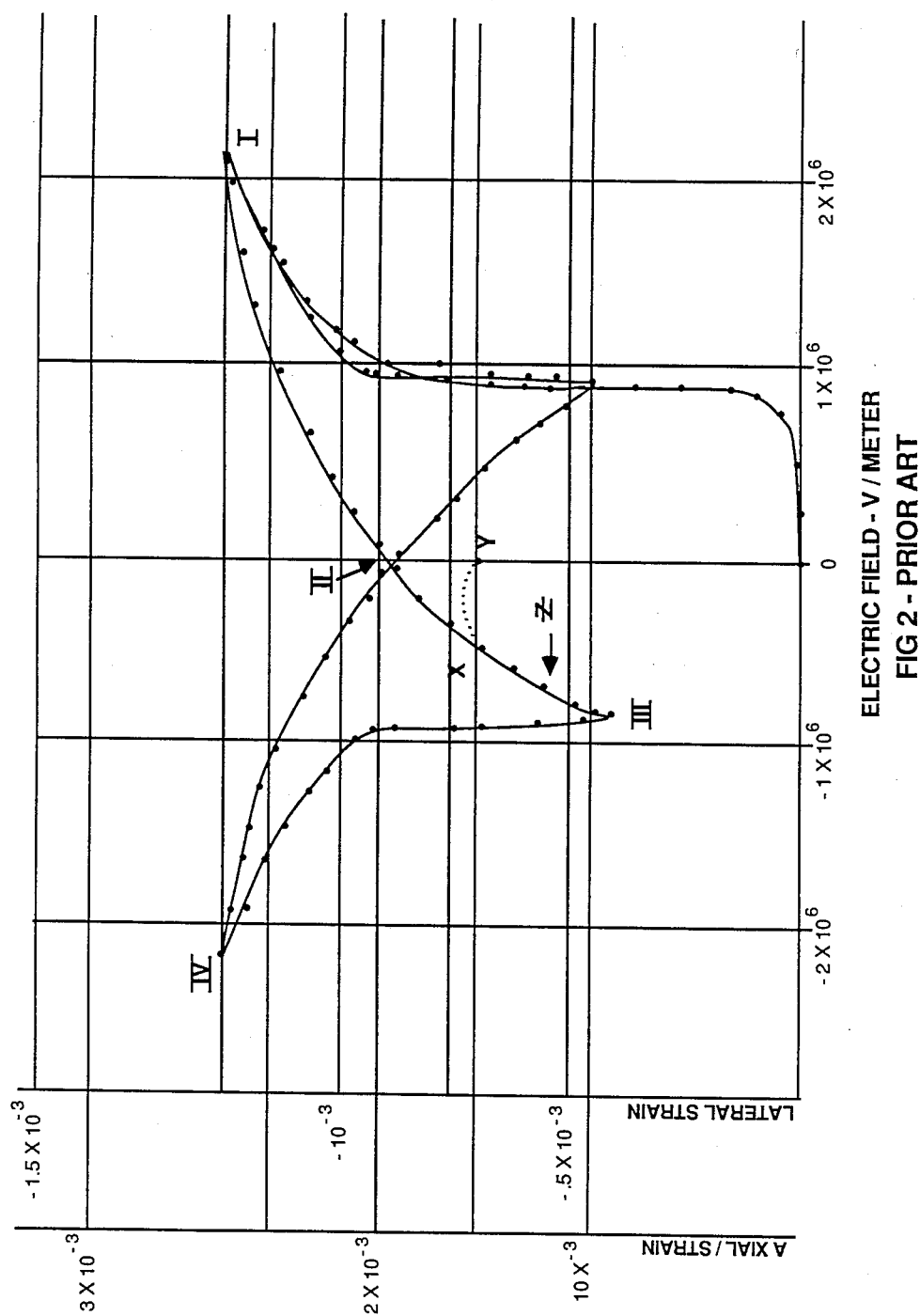

ELECTRICALLY INDUCED MECHANICAL PRECOMPRESSION OF FERROELECTRIC PLATES

The U.S. Government has rights in this invention pursuant to Contract No. DE-AC04-76DP00789 between the Department of Energy and AT&T Technologies, Inc.

BACKGROUND OF THE INVENTION

The present invention relates generally to precompressing ferroelectric plates, and more particularly to a method of electrically inducing mechanical precompression in ferroelectric plates used as sound projectors.

The use of ferroelectric ceramic materials as electrical-mechanical transducers is well known in the art. In particular, such materials are used as underwater sound transducers, where mechanical resonances of a ferroelectric ceramic plate generated by an applied ac voltage at certain frequencies are used to transmit sound. One such use is shown in applicant's U.S. Pat. No. 4,524,295, where mechanical resonances of a plate are used to generate mechanical waves.

Plates driven into flexural resonances by applied electrical signals are vibrated through the plane in which they lie at rest. For such simply supported plates vibrating in the fundamental mode, one side is alternately placed under tension and then compression, while the opposing side is under compression and then tension. The mechancial properties of the plate determine the maximum amplitude of vibration the plate may undergo without breaking. Since ceramics can withstand large compressive forces, but not large tensile forces, the failure is typically a tensile failure.

It is well known in the art to prestress materials such as ferroelectric ceramics to increase their power-handling capabilities. Prior prestressing techniques have relied on mechanically altering the material or using external agents. For example, U.S. Pat. No. 3,588,552 of Hugo Schafft applies a dc voltage to polarize a weighted disk to snap it into a retaining ring having a slightly smaller inside diameter than the outside diameter of the disk. U.S. Pat. No. 3,706,967 of Nicholas Renna prestresses piezoelectric staves by wrapping them with fiberglass under tension.

A disadvantage of known methods of prestressing ferroelectric ceramics is their use of mechanical processes; thereby increasing the degree of skill and cost of their manufacture. Applicant has reported on the mechanical responses of a ferroelectric ceramic to a slowly varying cyclic electric field (Int. J. Engng Sci. Vol. 19, 1981, pp. 147–158). This invention utilizes these responses to electrically prestress a ferroelectric ceramic.

SUMMARY OF THE INVENTION

It is an object of this invention to mechanically prestress ferroelectric ceramic plates by polarizing the entire plate and subsequently partially depolarizing portions of the plate.

It is a further object of this invention to provide a method of electrically inducing precompression into a ferroelectric ceramic plate.

It is another object of this invention to provide a ferroelectric ceramic plate that is internally prestressed without the continued application of external force.

It is also an object of this invention to provide a method of stressing a central portion of a ferroelectric ceramic plate against an outer portion of the same plate.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise electrically polarizing a ferroelectric plate, thereby laterally shrinking it, and then electrically partially depolarizing only a central portion of the plate, thereby laterally stretching the central portion against the shrunk outer portion.

BRIEF DESCRIPTION OF THE DRAWINGS

The accompanying drawings, which are incorporated in and form part of the specification, illustrate an embodiment of the present invention and, together with the description, serve to explain the principles of the invention.

FIGS. 1a–1d illustrate an embodiment of the process steps of the invention.

FIG. 2 is a prior art graph of lateral and axial strains in a ceramic as functions of a slowly varying dc electric field.

DETAILED DESCRIPTION OF THE INVENTION

FIG. 1a shows plate 1 of a ferroelectric ceramic, a polycrystalline material composed of domains 2, each domain 2 consisting of several parallel dipoles. When the ceramic is in a virgin or thermally depoled state as shown in FIG. 1a, the domains are randomly oriented and there is no net polarization of the material. However, application of an external electric field to ceramic 1 tends to switch the domains in the direction of the field as shown in FIG. 1b.

The piezoelectric effect and the polarization due to domain switching of ferroelectric ceramic combine to cause a proportional change in the size the ceramic. FIG. 2 shows the change in lateral and axial strains as functions of an external electric field on a 5 mm cube of virgin PZT 65/35. (The strains in this FIGURE are measures of the changes in dimensions as functions of the absolute values of the dimensions.) Other experiments on disks of PZT 65/35 and other ferroelectric ceramics give similarly shaped curves, as is known in the art.

As shown in FIG. 2, relative to zero strain, axial strain increases and lateral strain decreases toward point I as the electric field in the ceramic is slowly increased (over tens of seconds) from 0 volts/meter to a value where the ceramic is in a poled state, with the switchable domains aligned. Slowly reducing the applied voltage to zero leaves the ceramic in the condition of point II, with some recovery towards the original size of the the virgin material.

There are two reasons for this recovery. First, there are two types of switchable domains in the ceramic material: permanently switchable and non-permanently switchable. The switchable domains are aligned when the electric field is at point I; some of the non-permanently switchable domains return to a random orientation when the electric field is removed. Secondly, the piezoelectric effect causes additional strains on the device. Removal of the electric field removes the piezoelectric contribution to the strains on the device.

The size of the ceramic continues to change as an opposite electric field is applied. For small opposite fields, the axial strain continues to decrease and the lateral strain continues to increase because the piezoelectric effect on the strains from the opposite field is opposite the previously aligned domains, and some of the domains become unaligned. After the field of point III, where all the switchable domains are unaligned, is exceeded, the domains begin again to become aligned in the opposite direction, causing the axial strain to increase and the lateral strain to decrease towards point IV.

When the electric field is removed at any point X between points II and III, the strains do not follow the curve of FIG. 2 back to point II. Instead, some of the permanently switchable domains tend to retain their existing orientation and the piezoelectric strains cease, the strains being indicated by point Y. Subsequently increasing the electric field for a ceramic at point Y causes the strains to again vary in accordance with the curve of FIG. 2.

The actual magnitudes of strains after removal of the electric field is dependent on the speed at which the field is removed. Opening switch 12 to rapidly remove the field causes the least change from the values of point X; slowly lowering the field back to zero may cause the values of the resulting strains to be lower than the values at X.

In addition, the electric field may also be removed after it has been increased past point III; however, the steepness of the strain curve after point III makes it more difficult to control the resulting strains.

The invention laterally preshrinks a ceramic plate utilizing the changes in strains shown by FIG. 2. The steps of the invention are illustrated in FIGS. 1a–1d wherein the dimensions have been greatly exaggerated for purposes of illustration.

According to the invention, a thin plate 1 (with a lateral dimension in the L direction typically on the order of several centimeters, and an axial dimension in the A direction on the order of a millimeter) of unpoled ferroelectric ceramic has opposing surfaces covered by thin electrically conductive electrodes 5 and 6 having a thickness on the order of 1500 Angstroms. A variable dc power supply 10 is connected across electrodes 5 and 6 by electrical conductor 11 through switch 12.

When switch 12 is closed and the voltage from supply 10 increased over an interval of tens of seconds to the desired electric field, plate 1 becomes poled as shown in FIG. 1b. The ceramic is strained in accordance with the changes at point I of FIG. 2; i.e., it shrinks in the lateral dimension and it expands in the axial dimension, as indicated by the dashed arrows in FIG. 1b. There is some, but not total, size recovery as the voltage is slowly lowered to zero. If too great an electric field is applied, plate 1 may shatter.

In accordance with the teachings of this invention, in order to prestress ceramic 1, the inner portion is now expanded back against the shrunk outer portion. As shown in FIG. 1c, the outer portion of each electrode is removed, leaving only the central portion of disk 1 covered by electrodes 7 and 8. These electrodes are connected through switch 12 to power supply 10 for application of an opposite polarity electric field as shown by the dashed arrows in FIG. 1d to adjust the strains to point X of FIG. 2. The field is then removed to put the strains at point Y.

Since the opposite polarity electric field was applied only to the central portion of ceramic plate 1, the reduction in axial strain and increase in lateral strain occured only in the central portion. Therefore, as indicated in FIG. 1d, the central portion of plate 1 now pushes against the outer portion, resulting in a prestressed ceramic.

A plate can also be constructed in accordance with the teachings of this invention with the amount of stress proportioned along the lateral direction. After the central portion has been prestressed to point X, an outer portion of the electrodes over the central portion can be removed, and the opposite electric field applied to move the strains on the remaining inner portion to point Z on the curve of FIG. 2, between point X and point III. Additional concentric rings can be stressed such that the resulting ceramic plate has the greatest amount of prestress at the center, varying to a lesser amount towards the edge. Such a plate would be most compatible with the fundamental flexual mode of a simply supported plate for achieving large amplitude as a sound transducer with reduced possibility of tensile failure.

The preferred embodiment contemplated for use of this invention is with a ceramic disk, each electrode 5, 6 and 7, 8 forming a circle coaxial with the disk, and the intersection of each central and outer portions forming a cylinder concentric about the axis of the disk. However, other concentric patterns would work, although the process would require greater care to prevent stress cracking of the disk at pattern corners.

The preferred method of providing zones of different strain is to remove the outer electrodes as the process progresses. However, the central portion could also be defined by cutting an insulating line in electrodes 5 and 6 at the edge of the central portion, connecting conductor 11 to the central portion of electrodes 5 and 6, and leaving the electrically inert outer portion of electrodes 5 and 6 in place.

It should be understood that the maximum amount of expansion of a central portion against a shrunk outer portion is controlled by the dimensions of the plate. A laterally thick outer portion could withstand without fracture a much greater difference in stress at the junction with the central portion than could a laterally thin outer portion.

The particular sizes and equipment discussed above are cited merely to illustrate a particular embodiment of this invention. It is contemplated that the use of the invention may involve components having different sizes and shapes as long as the principle of electrically inducing opposing strains into a ceramic is followed. It is intended that the scope of the invention be defined by the claims appended hereto.

I claim:
1. A method of mechanically precompressing a ferroelectric plate having opposed surfaces and including an outer portion surrounding a central portion, said method comprising the steps of:
   electrically polarizing said plate, whereby the plate is axially stretched and laterally shrunk; and
   electrically partially depolarizing only the central portion of said plate, whereby the central portion is laterally expanded against the outer portion of said plate.

2. The method of claim 1 wherein said step of electrically polarizing said plate comprises:
   covering each surface of said plate with an electrically conductive electrode; and
   applying a first dc voltage across said electrodes to polarize said plate.

3. The method of claim 2 wherein said step of applying a first dc voltage comprises:
   slowly increasing the dc voltage from 0 volts to a first predetermined value;
   holding the dc voltage at the first predetermined value for a sufficient period of time to cause polarization of said material; and
   slowly reducing the dc voltage to 0 volts.

4. The method of claim 1 wherein said step of electrically partially depolarizing only the central portion of said plate comprises:
   applying a second dc voltage across electrodes covering only the central portion of said plate, the second dc voltage being of opposite polarity from the first dc voltage.

5. The method of claim 2 wherein said step of electrically partially depolarizing only the central portion of said plate comprises:
   removing only the portion of each electrode covering the outer portion of said plate; and
   applying a second dc voltage across the remaining electrodes, the second dc voltage being of opposite polarity from the first dc voltage.

6. The method of claim 4 wherein said step of applying a second dc voltage comprises:
   slowly increasing the dc voltage from 0 volts to a second predetermined value;
   holding the dc voltage at the second predetermined value for a sufficient period of time to cause partial depolarization of said material; and
   reducing the dc voltage to 0 volts.

7. The method of claim 1 wherein said central portion comprises a middle portion surrounding an inner portion, and further comprising the steps of:
   further partially depolarizing only the inner portion of said plate, whereby the inner portion is laterally expanded against the middle portion of said plate.

8. The method of claim 1 wherein said ferroelectric plate is a disk, and the intersection of said outer and central portions is defined by a cylinder concentric about the axis of said disk.

9. The method of claim 7 wherein said ferroelectric plate is a disk, and the intersections between said outer, middle, and inner portions are defined by cylinders concentric about the axis of said disk.

10. A method of mechanically precompressing a ferroelectric plate having opposed surfaces and including an outer portion surrounding a middle portion surrounding an inner portion, said method comprising the steps of:
    covering each surface of said plate with an electrode;
    applying a first dc voltage across said electrodes to electrically polarize said plate, whereby the plate is axially stretched and laterally shrunk;
    applying a second dc voltage across electrodes covering only the middle and inner portions of said plate, the second dc voltage being of opposite polarity from the first dc voltage, whereby said middle and inner portions are laterally expanded against the outer portion of said plate; and
    applying a third dc voltage across electrodes covering only the inner portion of said plate, the third dc voltage being of the same polarity and of greater magnitude than the second dc voltage, whereby said inner portion is laterally expanded against the middle portion of said plate.

11. The method of claim 10 wherein said ferroelectric plate is a disk, and the intersections between said outer, middle, and inner portions are defined by cylinders concentric about the axis of said disk.

* * * * *